United States Patent
Kim et al.

(10) Patent No.: US 12,191,141 B2
(45) Date of Patent: Jan. 7, 2025

(54) PLASMA ETCHING METHOD USING PERFLUOROISOPROPYL VINYL ETHER

(71) Applicant: AJOU UNIVERSITY INDUSTRY-ACADEMIC COOPERATION FOUNDATION, Suwon-si (KR)

(72) Inventors: Chang-Koo Kim, Seoul (KR); Jun-Hyun Kim, Seongnam (KR)

(73) Assignee: AJOU UNIVERSITY INDUSTRY-ACADEMIC COOPERATION FOUNDATION, Suwon-si (KR)

(*) Notice: Subject to any disclaimer, the term of this patent is extended or adjusted under 35 U.S.C. 154(b) by 288 days.

(21) Appl. No.: 17/917,155

(22) PCT Filed: Feb. 18, 2021

(86) PCT No.: PCT/KR2021/002053
§ 371 (c)(1),
(2) Date: Oct. 5, 2022

(87) PCT Pub. No.: WO2021/206287
PCT Pub. Date: Oct. 14, 2021

(65) Prior Publication Data
US 2023/0162972 A1 May 25, 2023

(30) Foreign Application Priority Data
Apr. 6, 2020 (KR) .......... 10-2020-0041505

(51) Int. Cl.
H01L 21/02 (2006.01)
H01L 21/311 (2006.01)
H01J 37/32 (2006.01)

(52) U.S. Cl.
CPC .. *H01L 21/02164* (2013.01); *H01L 21/31116* (2013.01); *H01L 21/31144* (2013.01); *H01J 37/32009* (2013.01); *H01J 2237/334* (2013.01)

(58) Field of Classification Search
None
See application file for complete search history.

(56) References Cited

U.S. PATENT DOCUMENTS

| | | | |
|---|---|---|---|
| 6,514,425 B1 * | 2/2003 | Sekiya | H01L 21/3065 438/723 |
| 2007/0187362 A1 * | 8/2007 | Nakagawa | C23F 4/00 216/81 |
| 2019/0027368 A1 * | 1/2019 | Matsuura | H01L 21/31116 |
| 2020/0035502 A1 * | 1/2020 | Kim | H01L 21/31116 |
| 2020/0048550 A1 * | 2/2020 | Kim | H01L 21/31116 |

OTHER PUBLICATIONS

Mikio Nagai et al (Low-k SiOCH film etching process and its diagnostics employing Ar/C 5F100/N2 plasma; Japanese Journal of Applied Physics vol. 45, No. 9A, 2006, pp. 7100-7104 (Year: 2006).*

* cited by examiner

*Primary Examiner* — Shamim Ahmed
(74) *Attorney, Agent, or Firm* — Sughrue Mion, PLLC

(57) ABSTRACT

A plasma etching method is disclosed. The plasma etching method comprises: a first step of vaporizing liquid perfluoroisopropyl vinylether (PIPVE); a second step of supplying, to a plasma chamber in which an object to be etched is arranged, the vaporized PIPVE and a discharge gas comprising argon gas; and a third step of discharging the discharge gas so as to generate plasma, and using same so as to plasma-etch the object to be etched.

8 Claims, 6 Drawing Sheets

PLASMA ETCHING METHOD USING PERFLUOROISOPROPYL VINYL ETHER

CROSS REFERENCE TO RELATED APPLICATIONS

This application is a National Stage of International Application No. PCT/KR2021/002053 filed Feb. 18, 2021, claiming priority based on Korean Patent Application No. 10-2020-0041505 filed Apr. 6, 2020.

FIELD

The present disclosure relates to a plasma etching method using PIPVE (perfluoroisopropyl vinyl ether) with a low global warming potential as a discharge gas.

DESCRIPTION OF RELATED ART

Demand for a structure having a high aspect ratio is increasing due to high density of an integrated circuit and miniaturization of an element in a semiconductor device. In general, the high aspect ratio structure is fabricated in an insulating layer for electrically separating the structure from a conductive layer. In order to manufacture such a high aspect ratio structure, a scheme of plasma etching silicon oxide ($SiO_2$) is widely used. Currently, in the plasma etching process of silicon oxide, perfluorocarbon (PFC) gas such as $CF_4$, $C_2F_6$, $C_3F_6$, $C_3F_8$, and $C_4F_8$ is mainly used. The PFC gas generates various active species under plasma. In this regard, using $CF_x$ active species, a fluorocarbon thin film as a carbon-based polymer is deposited on a substrate surface, thereby protecting a mask, and serving as a source of an etching agent to improve a selectivity with respect to the mask.

However, the fluorocarbon thin film deposited during the plasma etching may interfere with diffusion of reactive ions and radicals depending on a thickness thereof, thereby lowering an etch rate. Further, excessive deposition of the fluorocarbon thin film on a wall face of an etched structure may cause etching stop, such that a target etching depth is not achieved, and, further, a diameter of a bottom of the etched structure is smaller than a diameter of the mask.

Further, PFC is one of 6 major greenhouse gases ($CO_2$, $CH_4$, $N_2O$, HFC, PFC, $SF_6$). The PFC gas is chemically stable and has a long average residence time in the atmosphere and thus a high global warming potential (GWP) value which is higher, by 6500 times or greater, than GWP of $CO_2$. Thus, the small amount of the PFC gas may greatly contribute to the global warming effect. In addition, as a proportion of the etching process in a semiconductor device manufacturing process increases, an annual discharge amount of the PFC gas is continuously increasing. Thus, in order to reduce the emission of PFC gas, various methods such as PFC gas decomposition, separation and collection have been employed. However, those methods have fundamental limits due to the PFC gas having the high GWP.

Therefore, there are a need for a novel etchant which may replace the conventional PFC gas, have a low GWP and thus are environmentally friendly, have an excellent etching characteristic to allow a high aspect ratio etched structure to be formed, and a need for a plasma etching method using the novel etchant.

DISCLOSURE

Technical Purposes

One purpose of the present disclosure is to provide a plasma etching method using PIPVE having a low global warming potential as a discharge gas in place of the conventional PFC gas having a high global warming potential.

Technical Solutions

One aspect of the present disclosure provides a plasma etching method comprising: a first step of vaporizing liquid perfluoroisopropyl vinyl ether (PIPVE): a second step of supplying a discharge gas containing the vaporized PIPVE and argon gas to a plasma chamber in which an etching target is disposed; and a third step of discharging the discharge gas to generate plasma and of performing plasma etching on the etching target using the generated plasma.

In one implementation, in order to vaporize the liquid PIPVE and then provide the vaporized PIPVE to the etching chamber, a first container accommodating the liquid PIPVE therein may be heated to a first temperature equal to or higher than a boiling point of the PIPVE, and a connecting pipe connecting the first container to the etching chamber may be heated to a second temperature higher than the first temperature.

In one implementation, the vaporized PIPVE and the argon gas may be supplied to the etching chamber at a flow rate ratio in a range of 12:88 to 8:92.

In one implementation, the discharge gas may further contain oxygen. In one implementation, the PIPVE gas, the argon gas and the oxygen may be supplied to the etching chamber so that a ratio of a flow rate of the oxygen and a sum of a flow rate of the PIPVE gas and the flow rate of the argon gas is in a range of 1:9 to 2:8.

In one implementation, a bias voltage in a range of −1200V to −800V may be applied to a substrate supporting the etching target thereon in the etching chamber during the third step.

In one implementation, a source power in a range of 300 to 1500 W may be applied to a plasma source coupled to the etching chamber to generate plasma of the discharge gas during the third step.

In one implementation, the etching target may be a silicon oxide thin film.

Technical Effects

According to the present disclosure, the PIPVE has a 3 of GWP, which is remarkably lower than that of the conventional PFC gas. Thus, a mixed gas of PIPVE and argon (Ar) or a mixed gas of PIPVE and argon (Ar) and oxygen ($O_2$) may be provided as a discharge gas to perform the plasma etching process. Thus, compared to the plasma etching process using the existing PFC gas, emission of greenhouse gas may be significantly reduced, and plasma etching may be performed at excellent etching properties.

In particular, according to the plasma etching process of the present disclosure, a deposition rate of the fluorocarbon thin film on the etching target may be reduced and the etch rate on the etching target may be increased, so that the etching target may be etched while appropriately controlling the thickness of the fluorocarbon thin film. When plasma etching is performed on the etching target using a hole pattern mask, a high aspect ratio etched structure in which the diameter of the hole pattern mask and the diameter of the etched structure is substantially equal to each other may be formed.

DETAILED DESCRIPTIONS

Figure 1:
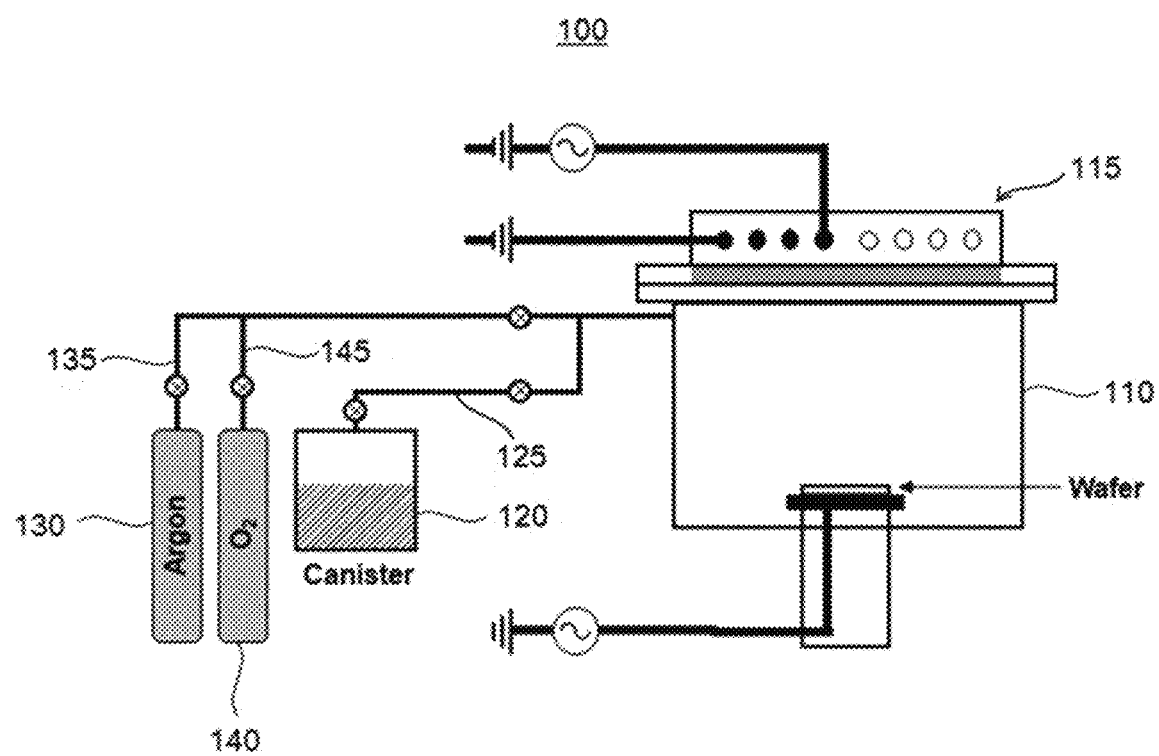
FIG. 1 is a schematic diagram of a plasma etching apparatus for illustrating a plasma etching method according to an embodiment of the present disclosure.

Hereinafter, an embodiment of the present disclosure will be described in detail with reference to the accompanying drawings. The present disclosure may be variously modified and may take many forms. Thus, specific embodiments will be illustrated in the drawings and described in detail herein. However, the specific embodiments are not intended to limit the present disclosure thereto. It should be understood that all changes, equivalents thereto, or substitutes therewith are included in a scope and spirit of the present disclosure. In describing the drawing, similar reference numerals are used for similar components.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or greater other features, integers, operations, elements, components, and/or portions thereof.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic diagram of a plasma etching apparatus capable of performing a plasma etching method according to an embodiment of the present disclosure.

Referring to FIG. 1, the plasma etching method according to an embodiment of the present disclosure may include providing a discharge gas containing perfluoroisopropyl vinyl ether (PIPVE) gas and argon (Ar) gas into a plasma chamber in which an etching target is disposed, such that plasma etching on the etching target is performed.

The etching target is not particularly limited, but may be a silicon oxide layer, a silicon nitride layer, or the like, which generally functions as an insulating layer in a semiconductor device manufacturing process. For example, the etching target may be a silicon oxide layer such as a silicon dioxide layer.

In one embodiment, the discharge gas may further contain oxygen ($O_2$) gas in addition to the PIPVE and the argon.

The PIPVE is known to have physical properties shown in a following Table 1, and has a boiling point of 35° C., and thus exists in a liquid state at room temperature, and has a GWP of 3, which is significantly lower than that of PFC compounds.

TABLE 1

| Chemical structure | |
|---|---|
| Molecular formula | $C_5F_{10}O$ |
| M.W. (g/mol) | 266 |
| Boiling Point (° C.) | 35.0 |
| Density (g/mL)(25° C.) | 1.609 |
| GWP (Global Warming Potential) | 3 |

In one embodiment, the plasma etching method according to the embodiment of the present disclosure may be performed using the etching apparatus shown in FIG. 1. In one embodiment, the etching apparatus 100 may include an etching chamber 110, a first container 120, a second container 130 and a third container 140. The etching chamber 110 may be coupled to a plasma source 115 and may have a discharge space accommodating an etching target therein. The discharge space may receive the discharge gas from the first to third containers 120, 130, and 140, and the plasma source 115 may apply a discharge voltage to the discharge gas to generate plasma.

The first to third containers 120, 130, and 140 may be connected to the etching chamber 110 via first to third connection pipes 125, 135, and 145, respectively. PIPVE in a liquid state may be accommodated in the first container 120, and argon gas and oxygen gas may be accommodated in the second and third containers 130 and 140, respectively.

The PIPVE accommodated in the first container 120 has a boiling point of 35° C. and thus exists as a liquid at room temperature. Thus, in order that the liquid PIPVE uniformly flows into the etching chamber 110, the PIPVE may be vaporized and then provided to the discharge space of the etching chamber 110. In one embodiment, the vaporization of the PIPVE may be carried out by heating the first container 120 accommodating the liquid PIPVE therein and the first connection pipe 125 connecting the first container 120 and the etching chamber 110 to each other to a temperature higher than the boiling point of the PIPVE. In one example, in one embodiment, in order that variation in a flow rate of the PIPVE being provided to the etching chamber 110 due to droplet splashing is prevented, the first container 120 may be heated to a first temperature higher than the boiling point of the PIPVE, while the first connection pipe 125 may be heated to a second temperature higher than the first temperature. For example, the first container 120 may be heated to a temperature of about 65 to 75° C. using a heating jacket, and the first connection pipe 125 may be heated to a temperature of about 85 to 95° C. In one example, a mass flow controller may be installed at an outlet of the first connection pipe 125 such that the vaporized PIPVE flows to the discharge space of the etching chamber 110 at a constant flow rate.

The argon gas accommodated in the second container 130 and the oxygen gas accommodated in the third container 140 may be provided to the discharge space of the etching chamber 110 via the second connection pipe 135 and the third connection pipe 145, respectively different from the first connection pipe 125.

According to the present disclosure, when the Ar gas and the PIPVE gas are fed to the discharge space of the etching chamber 110 and then the plasma is generated, a plasma density may be increased, and anisotropic etching of the etching target may be performed via ion bombardment. Specifically, when electropositive Ar is added to electronegative fluorocarbon plasma, the plasma density may be improved such that decomposition of a precursor such as PIPVE may be increased, thereby greatly affecting a gas phase and a surface chemistry. For example, a representative change in the surface chemistry due to the addition of Ar may be a decrease in a fluorine content of a steady state fluorocarbon formed on a surface. Further, since Ar is electropositive, Ar moves in an accelerated manner toward a negatively charged wafer to conduct ion bombardment thereon. Accordingly, the anisotropic etching may be achieved when a hole is formed in the wafer.

In one embodiment of the present disclosure, when the etching target is made of silicon oxide, the PIPVE gas and the Ar gas may be provided to the discharge space of the etching chamber 110 at a flow rate ratio in a range of about 1:4 (=20:80) to 1:19 (=5:95). When the flow rate ratio of the PIPVE gas and the Ar gas is lower than 1:4 (=20:80), there may be a problem that the etch rate on the etching target is too low. When the flow rate ratio of the PIPVE gas and the Ar gas exceeds 1:19 (=5:95), there is a problem in that the etch rate is significantly lowered due to a decrease in an amount of an etchant capable of etching the etching target. For example, when the etching target is made of silicon oxide, the PIPVE gas and the Ar gas may be provided to the discharge space of the etching chamber 110 at a flow rate ratio in a range of about 12:88 to 8:92, about 11:89 to 9:91, or at a flow rate ratio of about 10:90.

In one embodiment, when the discharge gas further includes oxygen ($O_2$) gas in addition to the PIPVE and the argon, the oxygen gas may appropriately control a thickness of the fluorocarbon thin film generated by the plasma etching to improve etching efficiency. For example, adding the oxygen ($O_2$) gas thereto may allow an excessive thickness of the fluorocarbon thin film to be reduced, thereby preventing inhibition of diffusion of reactive ions and radicals, such that the etching target may be etched at an excellent etch rate. Further, excessive deposition of the fluorocarbon thin film on a wall face of the etched structure may be prevented, such that unwanted etching stop may be prevented and thus etching may be performed to a desired depth. Thus, when an etched structure is formed in the etching target using a hole pattern mask according to the plasma etching method of the present disclosure, a high aspect ratio etched structure in which a diameter of the etched structure is equal to a diameter of the hole pattern mask may be formed. However, when a content of the oxygen ($O_2$) gas in the discharge gas is excessively high, the formation of the fluorocarbon thin film serving as a source of the etching target such as silicon oxide is excessively suppressed, thereby inhibiting anisotropic etching of the etching target. In one embodiment, the PIPVE gas, the oxygen ($O_2$) gas, and the argon gas may be provided to the etching chamber such that a ratio of a flow rate of the oxygen ($O_2$) gas and a sum of the flow rate of the PIPVE gas and the flow rate of the argon gas is in a range of about 1:9 to 2:8. For example, the PIPVE gas, the oxygen ($O_2$) gas, and the argon gas may be provided to the etching chamber such that a ratio of a flow rate of the oxygen ($O_2$) gas and a sum of the flow rate of the PIPVE gas and the flow rate of the argon gas is about 2:8

In one example, in the plasma etching method according to the embodiment of the present disclosure, a bias voltage applied to a substrate supporting the etching target thereon may be a voltage lower than or equal to about −800V, or about lower than or equal to −1000V, for example, a voltage in a range of about −1200V to −800V or −1200 to −1000V. When the bias voltage exceeds −800V, there may be a problem that the etch rate on the etching target is too low. When the bias voltage is lower than −1200V, there may be a problem of increasing only power consumption without further improvement of the etch rate.

Further, in the plasma etching method according to the embodiment of the present disclosure, a source power applied to a plasma source 115 to generate the plasma of the discharge gas may be about 300 W or higher, or about 400 W or higher, or about 500 W or higher. When the source power is lower than 300 W, there may be a problem that the etch rate on the etching target is remarkably low. In one example, the source power applied to the plasma source 115 to reduce power consumption may be about 1500 W or lower.

According to the present disclosure, PIPVE has a 3 of GWP, which is remarkably lower than that of the conventional PFC gas. Thus, a mixed gas of PIPVE and argon (Ar) or a mixed gas of PIPVE and argon (Ar) and oxygen ($O_2$) may be provided as a discharge gas to perform the plasma etching process. Thus, compared to the plasma etching process using the existing PFC gas, emission of greenhouse gas may be significantly reduced, and plasma etching may be performed at excellent etching properties.

In particular, according to the plasma etching process of the present disclosure, a deposition rate of the fluorocarbon thin film on the etching target may be reduced and the etch rate on the etching target may be increased, so that the etching target may be etched while appropriately controlling the thickness of the fluorocarbon thin film. When plasma etching is performed on the etching target using a hole pattern mask, a high aspect ratio etched structure in which the diameter of the hole pattern mask and the diameter of the etched structure is substantially equal to each other may be formed. A more detailed description thereof will be described with reference to following examples of the present disclosure.

Hereinafter, more specific examples and experimental examples will be described. However, the following examples are only some implementations of the present disclosure, and the scope of the present disclosure is not limited to the following examples.

EXAMPLE

Plasma etching was performed on a $SiO_2$ thin film formed on a surface of a silicon substrate under various conditions and using a mixed gas of PIPVE and argon as a discharge gas. In this regard, in vaporizing the liquid PIPVE and supplying the vaporized PIPVE to the etching chamber, a canister accommodating therein the liquid PIPVE was heated to 70° C., and a connecting line connecting the canister and the etching chamber to each other was heated to 90° C.

Experimental Example

Figure 2:
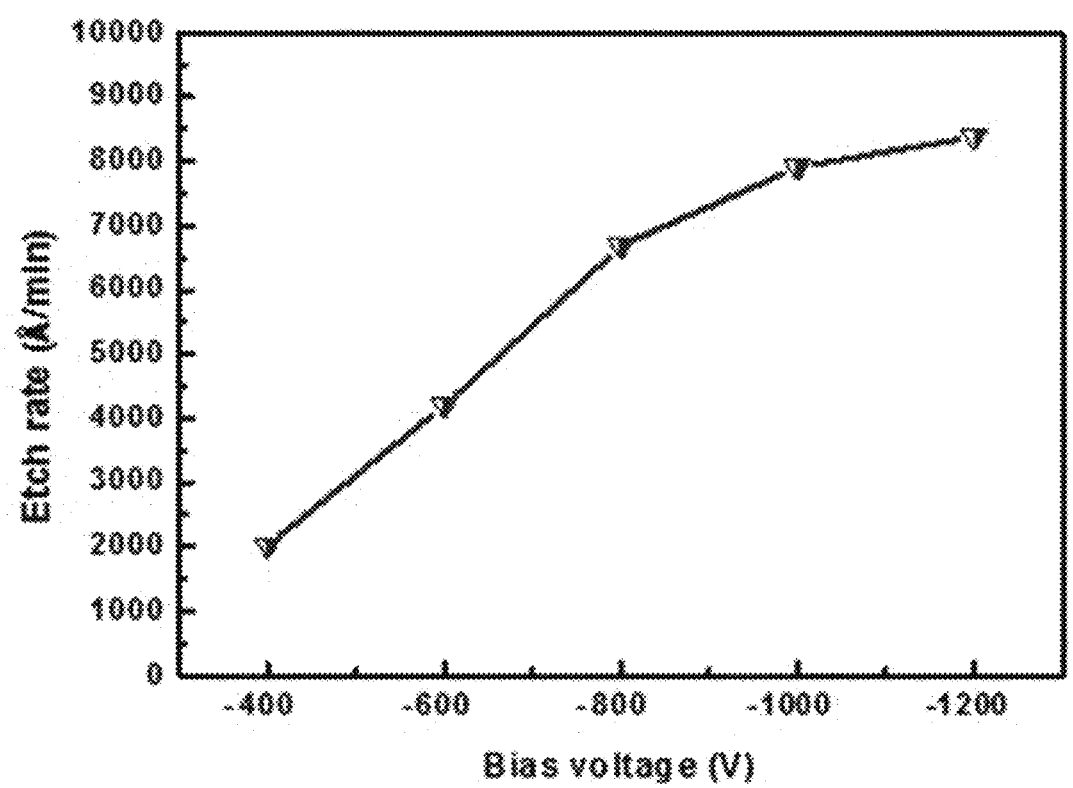
FIG. 2 is a graph measuring a change in an etch rate of a $SiO_2$ thin film based on a bias voltage in a plasma etching process on the $SiO_2$ thin film under a condition shown in Table 2.

FIG. 2 is a graph measuring a change in an etch rate of a $SiO_2$ thin film based on a bias voltage in a plasma etching process on the $SiO_2$ thin film under a condition shown in Table 2. In this regard, a mixture of PIPVE and argon gas in a flow rate ratio of 1:9 was employed as the discharge gas.

TABLE 2

| Source power (W) | Bias voltage (V) | Discharge Gas | Total Flow Rate (sccm) | Pressure (mTorr) | Substrate Temperature (° C.) |
|---|---|---|---|---|---|
| 250 | −400 to −1200 | PIPVE/Ar | 30 | 10 | 15 |

Referring to FIG. 2 together with Table 2, it was identified that the etch rate increased as the bias voltage decreased. Specifically, when the bias voltage was in a range of −400V to −800V, the etch rate increased as the bias voltage decreased. When the bias voltage was in a range of about −800 to −1000V, increase in the etch rate due to the decrease in the bias voltage was significantly reduced. It was identified that when the bias voltage was in a range of about −1000V or greater, the etch rate hardly changed even when the bias voltage decreased. Accordingly, the bias voltage is preferably set to about −800V or lower or about-1000V or lower.

Figure 3:
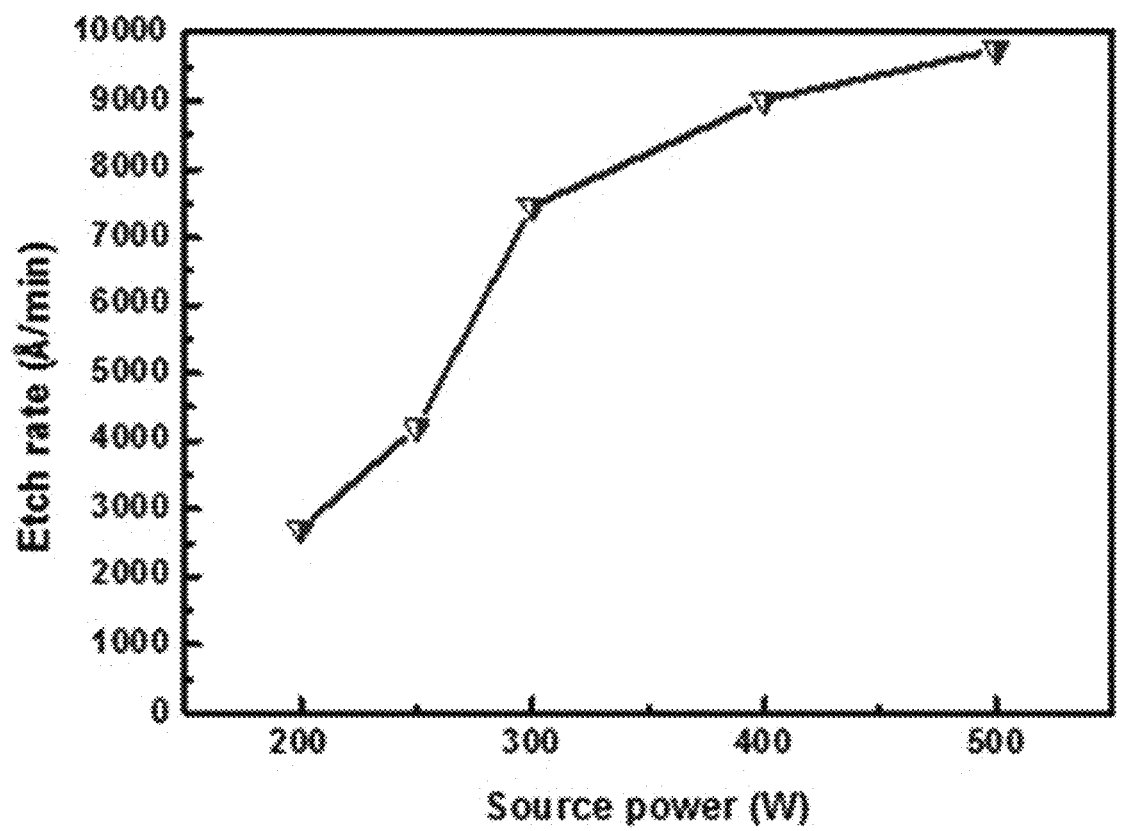
FIG. 3 is a graph measuring a change in an etch rate of a $SiO_2$ thin film based on a bias voltage in a plasma etching process on the $SiO_2$ thin film under a condition shown in Table 3.

FIG. 3 is a graph measuring a change in an etch rate of a $SiO_2$ thin film based on a bias voltage in a plasma etching process on the $SiO_2$ thin film under a condition shown in Table 3. In this regard, a mixture of PIPVE and argon gas in a flow rate ratio of 1:9 was employed as the discharge gas.

TABLE 3

| Source power (W) | Bias voltage (V) | Discharge Gas | Total Flow Rate (sccm) | Pressure (mTorr) | Substrate Temperature (° C.) |
|---|---|---|---|---|---|
| 200 to 500 | −600 | PIPVE/Ar | 30 | 10 | 15 |

Referring to FIG. 3 together with Table 3, it was identified that the etch rate increased as the source power increased. Specifically, when the source power was lower than 300 W, the etch rate rapidly increased as the source power increased. However, when the source power was 300 W or greater, the increase in the etch rate was significantly reduced. Accordingly, it is preferable to apply the source power at about 300 W or greater, preferably about 400 W or greater.

Figure 4:
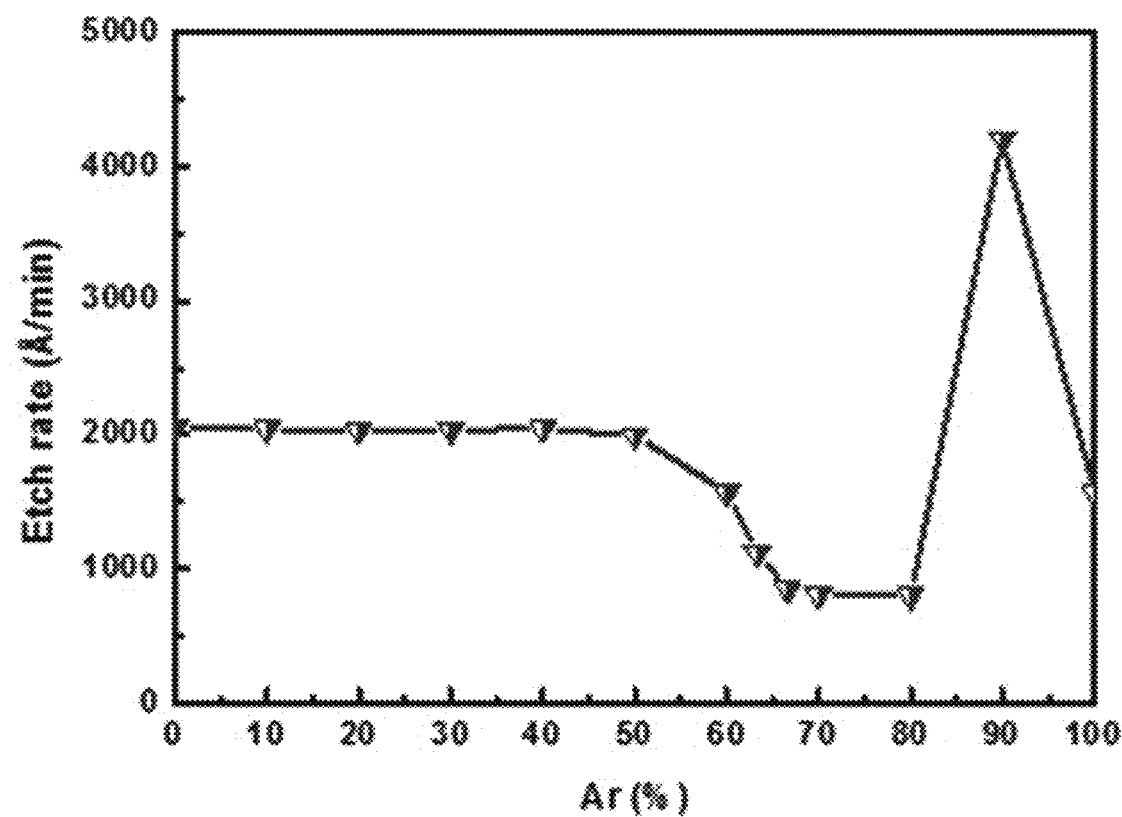
FIG. 4 is a graph measuring a change in an etch rate of a $SiO_2$ thin film based on a flow rate ratio of argon gas in a discharge gas composed of PIPVE and the argon gas in a plasma etching process on the $SiO_2$ thin film under a condition shown in Table 4.

FIG. 4 is a graph measuring a change in an etch rate of a $SiO_2$ thin film based on a flow rate ratio of argon gas in a discharge gas composed of PIPVE and the argon gas in a plasma etching process on the $SiO_2$ thin film under a condition shown in Table 4.

TABLE 4

| Source power (W) | Bias voltage (V) | Discharge Gas | Total Flow Rate (sccm) | Pressure (mTorr) | Substrate Temperature (° C.) |
|---|---|---|---|---|---|
| 250 | −600 | PIPVE/Ar | 30 | 10 | 15 |

Referring to FIG. 4 together with Table 4, it was identified that the etch rate was significantly increased when a mixed gas of PIPVE and argon gas at a specific flow rate ratio was employed as a discharge gas. Specifically, it was identified that when a percentage of a flow rate of argon in a total flow rate of the discharge gas was smaller than about 50%, the etch rate was maintained almost constant. When a percentage of a flow rate of argon in a total flow rate of the discharge gas was in a range of about 50 to 70%, the etch rate was rather decreased as the flow rate of argon was increased. When a percentage of a flow rate of argon in a total flow rate of the discharge gas was in a range of about 80 to 90%, the etch rate rapidly increased as the flow rate of argon increased. In addition, when a percentage of a flow rate of argon in a total flow rate of the discharge gas exceeded 90%, an amount of PIPVE was excessively reduced and thus the etch rate was rapidly reduced. Based on the above results, a percentage of a flow rate of argon in a total flow rate of the discharge gas is preferably in a range of about 85 to 95%, or about 88 to 92%, or is preferably about 90%.

Figure 5A:
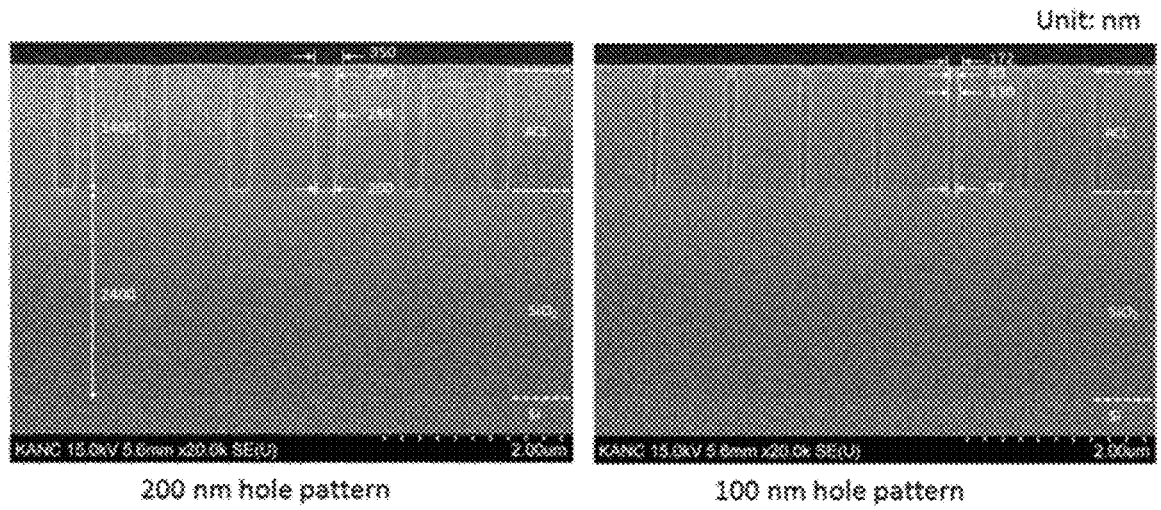
FIG. 5A is FE-SEM images of a silicon substrate, a $SiO_2$ thin film covering a surface thereof, and an etching mask formed thereon before plasma etching.
Figure 5B:
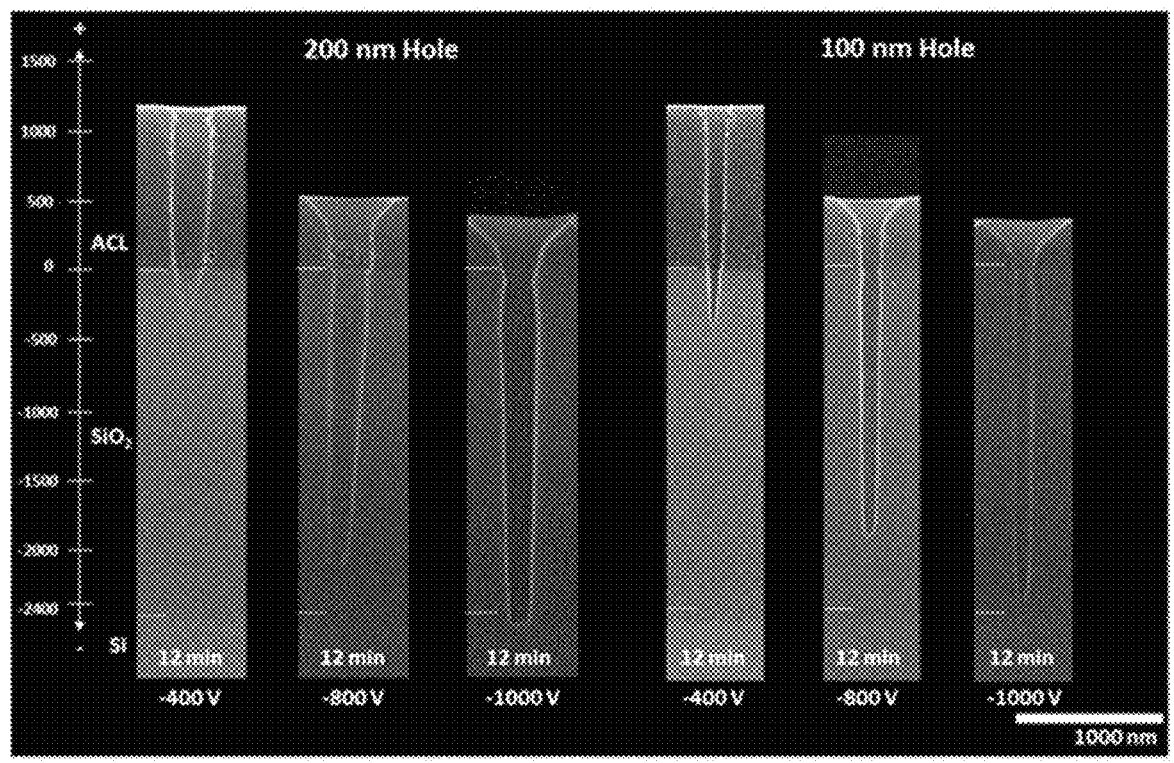
FIG. 5B is FE-SEM images showing an etching profile after performing plasma etching on the structure shown in FIG. 5A for 12 minutes via application of various bias voltages under a condition shown in Table 5.
Figure 5C:
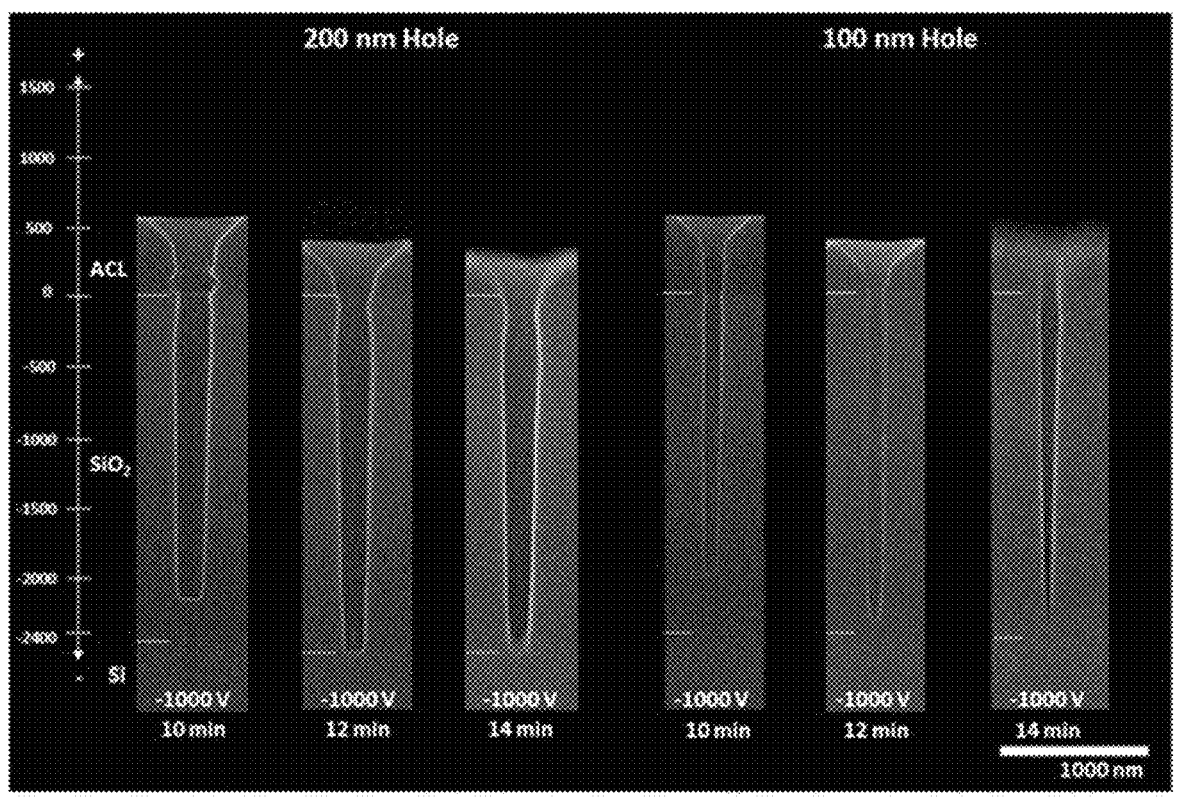
FIG. 5C is FE-SEM images showing an etching profile after performing plasma etching on the structure shown in FIG. 5A for various time durations under a condition shown in Table 6.

FIG. 5A is FE-SEM images of a silicon substrate, a $SiO_2$ thin film covering a surface thereof, and an etching mask formed thereon before plasma etching: FIG. 5B is FE-SEM images showing an etching profile after performing plasma etching on the structure shown in FIG. 5A for 12 minutes via application of various bias voltages under a condition shown in Table 5; and FIG. 5C is FE-SEM images showing an etching profile after performing plasma etching on the structure shown in FIG. 5A for various time durations under a condition shown in Table 6. In FIG. 5A to FIG. 5C, a left image is related to a structure to which a mask having a 200 nm-diameter hole pattern defined therein is applied, while a right image is related to a structure to which a mask having a 100-nm-diameter hole pattern defined therein is applied. Each of the masks includes a 1350 nm thick ACL layer disposed on the $SiO_2$ thin film and a 50 nm thick SiON layer coated on a surface of the ACL layer. A thickness of the $SiO_2$ thin film is 2400 nm.

TABLE 5

| Source power (W) | Bias voltage (V) | Discharge Gas | Total Flow Rate (sccm) | Pressure (mTorr) | Substrate Temperature (° C.) | Etching time (min) |
|---|---|---|---|---|---|---|
| 250 | −400 to −1000 | PIPVE/Ar (1:9) | 30 | 10 | 15 | 12 |

TABLE 6

| Source power (W) | Bias voltage (V) | Discharge Gas | Total Flow Rate (sccm) | Pressure (mTorr) | Substrate Temperature (° C.) | Etching time (min) |
|---|---|---|---|---|---|---|
| 250 | −1000 | PIPVE/Ar (1:9) | 30 | 10 | 15 | 10 to 14 |

Referring to FIG. 5A and FIG. 5B together with Table 5, it was identified that the etching depth increased as the bias voltage increased. Specifically, when the etching has been carried out for 12 minutes at a bias voltage of −1000 V, an etching depth has reached a bottom of the $SiO_2$ layer in the structure to which the mask having a 200 nm-diameter hole pattern defined therein was applied. When the etching has been carried out for 12 minutes at a bias voltage of −1000 V, an etching depth has not reached a bottom of the $SiO_2$ layer in the structure to which the mask having a 100 nm-diameter hole pattern defined therein was applied.

Referring to FIG. 5A and FIG. 5C together with Table 6, it was identified that the etching depth increased as the etching time increased. Specifically, when the etching has been carried out for 12 minutes, an etching depth has reached a bottom of the $SiO_2$ layer in the structure to which the mask having a 200 nm-diameter hole pattern defined therein was applied. When the etching has been carried out for 14 minutes, an etching depth has not reached a bottom of the $SiO_2$ layer in the structure to which the mask having a 100 nm-diameter hole pattern defined therein was applied.

Although the present disclosure has been described above with reference to the preferred embodiments of the present disclosure, those skilled in the art may variously modify and change the present disclosure without departing from the spirit and scope of the present disclosure as described in the claims below.

What is claimed is:

1. A plasma etching method comprising:
   a first step of vaporizing liquid perfluoroisopropyl vinyl ether (PIPVE);
   a second step of supplying a discharge gas containing the vaporized PIPVE and argon gas to a plasma chamber in which an etching target is disposed; and
   a third step of discharging the discharge gas to generate plasma and of performing plasma etching on the etching target using the generated plasma.

2. The method of claim 1, wherein in order to vaporize the liquid PIPVE and then provide the vaporized PIPVE to the etching chamber, a first container accommodating the liquid PIPVE therein is heated to a first temperature equal to or higher than a boiling point of the PIPVE, and a connecting pipe connecting the first container to the etching chamber is heated to a second temperature higher than the first temperature.

3. The method of claim 1, wherein the vaporized PIPVE and the argon gas are supplied to the etching chamber at a flow rate ratio in a range of 12:88 to 8:92.

4. The method of claim 1, wherein the discharge gas further contains oxygen.

5. The method of claim 4, wherein the PIPVE gas, the argon gas and the oxygen are supplied to the etching chamber so that a ratio of a flow rate of the oxygen and a sum of a flow rate of the PIPVE gas and the flow rate of the argon gas is in a range of 1:9 to 2:8.

6. The method of claim 1, wherein a bias voltage in a range of −1200V to −800V is applied to a substrate supporting the etching target thereon in the etching chamber during the third step.

7. The method of claim 6, wherein a source power in a range of 300 to 1500 W is applied to a plasma source coupled to the etching chamber to generate plasma of the discharge gas during the third step.

8. The method of claim 1, wherein the etching target is a silicon oxide thin film.

* * * * *